Figure 1:

United States Patent
Wisbey et al.

[11] 4,007,396
[45] Feb. 8, 1977

[54] LIGHT EMISSIVE DIODE DISPLAYS

[75] Inventors: Philip Henry Wisbey, Colchester; Paul Kevin Kimber, Bishop's Stortford, both of England

[73] Assignee: The Marconi Company Limited, Chelmsford, England

[22] Filed: Nov. 3, 1975

[21] Appl. No.: 628,224

[30] Foreign Application Priority Data
Nov. 6, 1974 United Kingdom ............ 47930/74

[52] U.S. Cl. .................... 313/500; 313/112; 313/113; 350/156; 357/17
[51] Int. Cl.$^2$ .................. A47B 88/00; A47B 95/00
[58] Field of Search ............ 13/500, 111, 112, 113; 357/17; 350/156, 157

[56] References Cited
UNITED STATES PATENTS

| | | | |
|---|---|---|---|
| 3,290,539 | 12/1966 | Lamorte | 313/500 X |
| 3,781,584 | 12/1973 | Kingsbury | 313/500 |
| 3,797,913 | 3/1974 | Mori et al. | 350/157 X |
| 3,799,647 | 3/1974 | Luft | 350/157 X |
| 3,883,772 | 5/1975 | Wako et al. | 313/500 X |

*Primary Examiner*—Stanley T. Krawczewicz
*Attorney, Agent, or Firm*—Baldwin, Wight & Brown

[57] ABSTRACT

An LED display is provided with a reflective surface over those parts of the display which do not themselves emit light. This enables a polarizer to be used to enhance the display contrast under conditions of bright ambient light.

8 Claims, 6 Drawing Figures

LIGHT EMISSIVE DIODE DISPLAYS

The present invention relates to light emissive diodes (LED) displays.

A major problem encountered in using self luminous displays in very bright environments, as for example an aircraft cockpit, is that serious degradation in contrast between activated display elements and their immediate surrounding can result from reflection, by the display, of ambient illumination.

The source of ambient illumination in aircraft cockpits is caused by the sun either when viewed directly or when diffused by light cloud, both of which images may be so bright as to make the display illegible. Although direct sunlight is the brighter of the two it may easily be avoided by an aircraft pilot who may simply move his head; clouds which diffuse the sunlight, however, being more extensive, present greater difficulties.

It has been proposed to improve the contrast by use of a circular polarizer in front of the display. In itself, however, a circular polarizer is not sufficiently effective with LED displays made by conventional techniques. One reason for this is that when the display is formed on a screen printed alumina substrate then if it is coated in black ink it depolarizes the incident illumination and full cancellation cannot take place. If gold is used to coat the substrate it too has been found to depolarize any circularly polarised light incident upon it and it is an object of the invention to mitigate this problem.

According to the present invention, the face of a substrate carrying light emissive diodes is covered by a mirror finished conductive layer covering most of the area surrounding the light emissive diodes.

Preferably the conductive layer is of aluminium or copper.

The conductive layer may suitably form part of the means whereby electrical connection is established with the display elements.

Conventionally, the light emissive diodes of an LED display are encapsulated in an epoxy resin or in a polymeric. It has been found, rather surprisingly, that such encapsulants exhibit birefringence and therefore tend to interfere with the polarization of a light reflected by the surface of the LED display and it is therefore preferable that the device be contained within a glass encapsulation or container.

Figure 5:
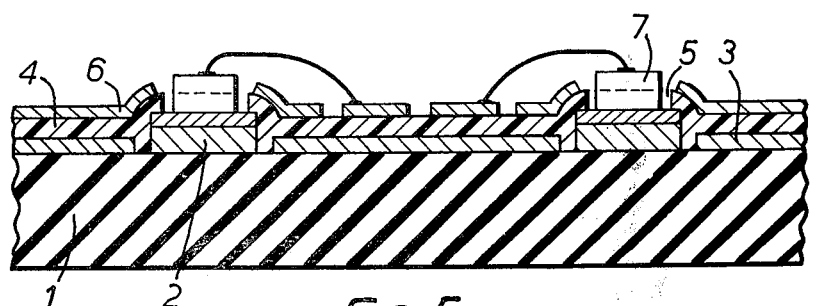
Figure 6:
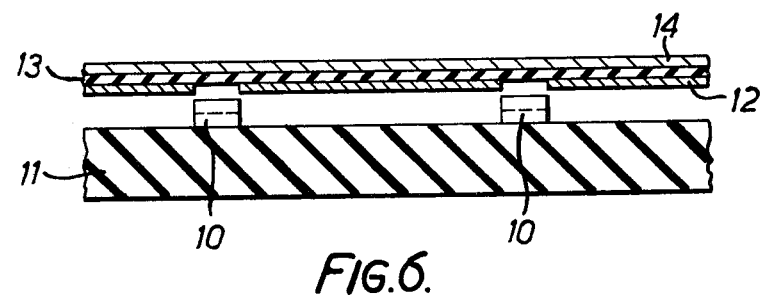

The invention will now be described, by way of example, with reference to:

FIGS. 1 to 5 of the accompanying drawings which show different stages in the manufacture of an LED display according to the invention and FIG. 6 which accompanies this specification, and which illustrates a modification of the present invention.

FIG. 1 shows a substrate which comprises a base 1 made of alumina or of a material such as is used in making printed circuit boards. A pattern of conductors 2, which may be the cathode pattern for the LED display is formed by photolithographic techniques on the surface of the base 1.

Figure 2:
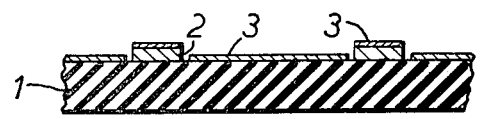

Referring to FIG. 2, the next step in the manufacture of an LED display is to aluminise the surface of the base 1 and the conductors 2, the aluminisation 3 being etched photolithographically so as to maintain isolation of the pattern conductors.

Figure 3:
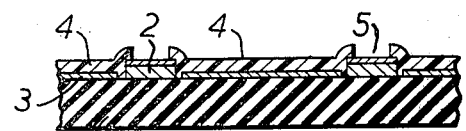
Figure 4:
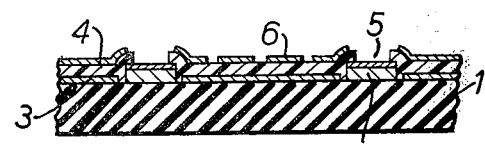

As may be seen from FIG. 3, an insulating layer 4 such as silicon dioxide is deposited over the whole surface of the device as so far formed and windows 5 are opened in the insulating layer 4 to allow access to the conductors 2.

A further layer of aluminium 6 is then deposited (see FIG. 4) onto the substrate and the contact conductor pattern for the anode connections to the display are derived in this further layer. The pattern leaves as much aluminium covering the top surface of the display as possible in order to provide a good reflector.

Finally, as seen in FIG. 5, LED devices 7 are mounted in the windows 5 and bonded out to the conductor pattern derived in the top aluminium layer 6.

Following its formation the display is encapsulated in anisotropic medium and viewed through a circular polarization filter.

As is well known, a circular polarizing filter may be constituted by the combination of a plane polarizer and a quarter wave plate. The light passing through the circular polarizer from an ambient source is converted to circularly polarised light of a predetermined 'handedness'. Upon reflection by the mirror finished aluminum top layer 6 the 'handedness' of polarization is reversed so that after passing through the quarter wave plate of the circular polarizer the light will be plane polarized at right angles to the polarization plane of the plane polarizer and will therefore not pass through. Consequently, light cannot be reflected by the overall display. Of course, reflections from the surface of the circular polarizer may themselves be cut down by well known coating techniques.

It will be understood that to obtain a mirror finish on the aluminium 6 it is necessary to start with a suitably finished base and that the alumina used as base material will have a glass like finish rather than the more common matt finish.

It would be alternatively possible to substitute copper for the top aluminium layer 6 but gold is to be avoided as it has the property of depolarizing the light which it reflects.

An alternative embodiment of the present invention is illustrated in FIG. 6 in which the LED devices 10 are mounted on a substrate 11 as before, but the highly reflecting surface is provided by an aluminium film 12 evaporated onto the underside of a glass cover 13. The circular polarizer is represented by the layer 14. The glass cover 13 is placed in close proximity to the substrate, and the aluminium film 12 is provided with windows corresponding to the positions of the LED devices. The upper surface of the aluminium film presents a mirror surface, and in combination with the circular polarizer prevents reflection of incident light. Instead of aluminium, a film of another material, such as copper, could be used. An arrangement as shown in FIG. 6 allows most of the substrate to be obscured by the reflecting film and can be used to hide the bonding wires (such wires are illustrated in FIG. 5) by using offset bonding pads.

We claim:

1. A light emissive diode display comprising, in combination:
   a base having a plurality of light emissive diodes carried thereby;
   a mirror finished conductive layer covering most of the area surrounding said light emissive diodes; and circular polarizer means overlying said base for allowing light emitted by said diodes to pass therethrough for viewing;

said conductive layer having the characteristic of reversing the handedness of light reflected therefrom whereby light passing through said circular polarizer means and having one handedness imparted thereto will upon reflection by said conductive layer have a handedness opposite to said one handedness such that the reflected light will not pass back through the circular polarizer means.

2. A light emissive diode display as defined in claim 1 wherein said conductive layer is copper.

3. A light emissive diode display as defined in claim 1 wherein said conductive layer is aluminum.

4. A light emissive diode display as defined in claim 1 including conductor means for establishing electrical connections to said diodes, said conductive layer forming at least part of said conductor means.

5. A light emissive diode display as defined in claim 2 including conductor means for establishing electrical connections to said diodes, said conductive layer forming at least part of said conductor means.

6. A light emissive diode display as defined in claim 3 including conductor means for establishing electrical connections to said diodes, said conductive layer forming at least part of said conductor means.

7. A light emissive diode display as claimed in claim 6 wherein the conductive layer is formed on the underside of a transparent cover plate through which the display is viewed.

8. A light emissive diode display as claimed in claim 6 in which a glass encapsulation is provided for the light emissive diodes.

* * * * *